United States Patent
Chen et al.

(10) Patent No.: US 7,816,219 B2
(45) Date of Patent: Oct. 19, 2010

(54) FIELD EFFECT TRANSISTORS (FETS) WITH MULTIPLE AND/OR STAIRCASE SILICIDE

(75) Inventors: Xiangdong Chen, Poughquag, NY (US); Sunfei Fang, LaGrangeville, NY (US); Zhijiong Luo, Carmel, NY (US); Haining Yang, Wappingers Falls, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 442 days.

(21) Appl. No.: 11/850,076

(22) Filed: Sep. 5, 2007

(65) Prior Publication Data
US 2007/0298572 A1 Dec. 27, 2007

Related U.S. Application Data

(62) Division of application No. 10/908,087, filed on Apr. 27, 2005, now Pat. No. 7,309,901.

(51) Int. Cl.
  *H01L 21/336* (2006.01)
(52) U.S. Cl. .................. 438/305; 438/586; 438/595; 438/655; 438/683; 257/384; 257/408; 257/E21.439
(58) Field of Classification Search .............. 438/231, 438/233, 305, 586, 656, 595, 655, 683; 257/384, 257/408, E21.439
See application file for complete search history.

(56) References Cited

U.S. PATENT DOCUMENTS

| 6,063,681 A * | 5/2000 | Son .......................... 438/303 |
| 6,255,703 B1 * | 7/2001 | Hause et al. ................ 257/384 |
| 2002/0008295 A1 | 1/2002 | Yang et al. |
| 2002/0137268 A1 | 9/2002 | Pellerin et al. |
| 2003/0183881 A1 * | 10/2003 | Lee et al. .................... 257/382 |

* cited by examiner

*Primary Examiner*—Mary Wilczewski
*Assistant Examiner*—Toniae M Thomas
(74) *Attorney, Agent, or Firm*—Schmeiser, Olsen & Watts; Katherine Brown

(57) ABSTRACT

A semiconductor structure and method for forming the same. First, a semiconductor structure is provided, including (a) a semiconductor layer including (i) a channel region and (ii) first and second source/drain (S/D) extension regions, and (iii) first and second S/D regions, (b) a gate dielectric region in direction physical contact with the channel region via a first interfacing surface that defines a reference direction essentially perpendicular to the first interfacing surface, and (c) a gate region in direct physical contact with the gate dielectric region, wherein the gate dielectric region is sandwiched between and electrically insulates the gate region and the channel region. Then, (i) a first shallow contact region is formed in direct physical contact with the first S/D extension region, and (ii) a first deep contact region is formed in direct physical contact with the first S/D region and the first shallow contact region.

13 Claims, 15 Drawing Sheets

FIELD EFFECT TRANSISTORS (FETS) WITH MULTIPLE AND/OR STAIRCASE SILICIDE

This application is a Divisional of Ser. No. 10/908,087, filed Apr. 27, 2005 now U.S. Pat. No. 7,309,901.

BACKGROUND OF THE INVENTION

1. Technical Field

The present invention relates to field effect transistors (FETs), and more specifically, to staircase silicide FETs.

2. Related Art

In a typical field effect transistor (FET), there is a trade-off balance between (a) operation control and (b) resistance. More specifically, to have a better control of the threshold voltage Vt of the FET (so-called short channel effect), the FET's source/drain (S/D) extension regions which are in direct physical contact with the FET's channel region are formed as thin as possible. However, the thinner the S/D extension regions, the higher the resistances of these S/D extension regions, which is undesirable.

Therefore, there is a need for an FET (and a method for forming the same) which has a better trade-off balance between operation control and resistance than that of the prior art.

SUMMARY OF THE INVENTION

The present invention provides a semiconductor structure, comprising (a) a semiconductor layer including (i) a channel region and (ii) first and second source/drain (S/D) extension regions, and (iii) first and second S/D regions, wherein the channel region is disposed between and in direct physical contact with the first and second S/D extension regions, wherein the first S/D extension region is disposed between and in direct physical contact with the first S/D region and the channel region, and wherein the second S/D extension region is disposed between and in direct physical contact with the second S/D region and the channel region; (b) a gate dielectric region in direction physical contact with the channel region via a first interfacing surface that defines a reference direction essentially perpendicular to the first interfacing surface; (c) a gate region in direct physical contact with the gate dielectric region, wherein the gate dielectric region is sandwiched between and electrically insulates the gate region and the channel region; (d) a first shallow contact region in direct physical contact with the first S/D extension region; and (e) a first deep contact region in direct physical contact with the first S/D region and the first shallow contact region, wherein the first shallow contact region is physically isolated from the semiconductor layer by the first S/D region and the first S/D extension region, and wherein the first shallow contact region is thinner than the first deep contact region in the reference direction.

The present invention also provides a semiconductor structure fabrication method, comprising (A) providing a semiconductor structure comprising (a) a semiconductor layer including (i) a channel region and (ii) first and second source/drain (S/D) extension regions, and (iii) first and second S/D regions, wherein the channel region is disposed between and in direct physical contact with the first and second S/D extension regions, wherein the first S/D extension region is disposed between and in direct physical contact with the first S/D region and the channel region, and wherein the second S/D extension region is disposed between and in direct physical contact with the second S/D region and the channel region, (b) a gate dielectric region in direction physical contact with the channel region via a first interfacing surface that defines a reference direction essentially perpendicular to the first interfacing surface, and (c) a gate region in direct physical contact with the gate dielectric region, wherein the gate dielectric region is sandwiched between and electrically insulates the gate region and the channel region; and (B) forming (i) a first shallow contact region in direct physical contact with the first S/D extension region, and (ii) a first deep contact region in direct physical contact with the first S/D region and the first shallow contact region, wherein the first shallow contact region is physically isolated from the semiconductor layer by the first S/D region and the first S/D extension region, and wherein the first shallow contact region is thinner than the first deep contact region in the reference direction.

The present invention provides an FET (and a method for forming the same) which has a better trade-off balance between operation control and resistance than that of the prior art.

DETAILED DESCRIPTION OF THE INVENTION

Figure 1:
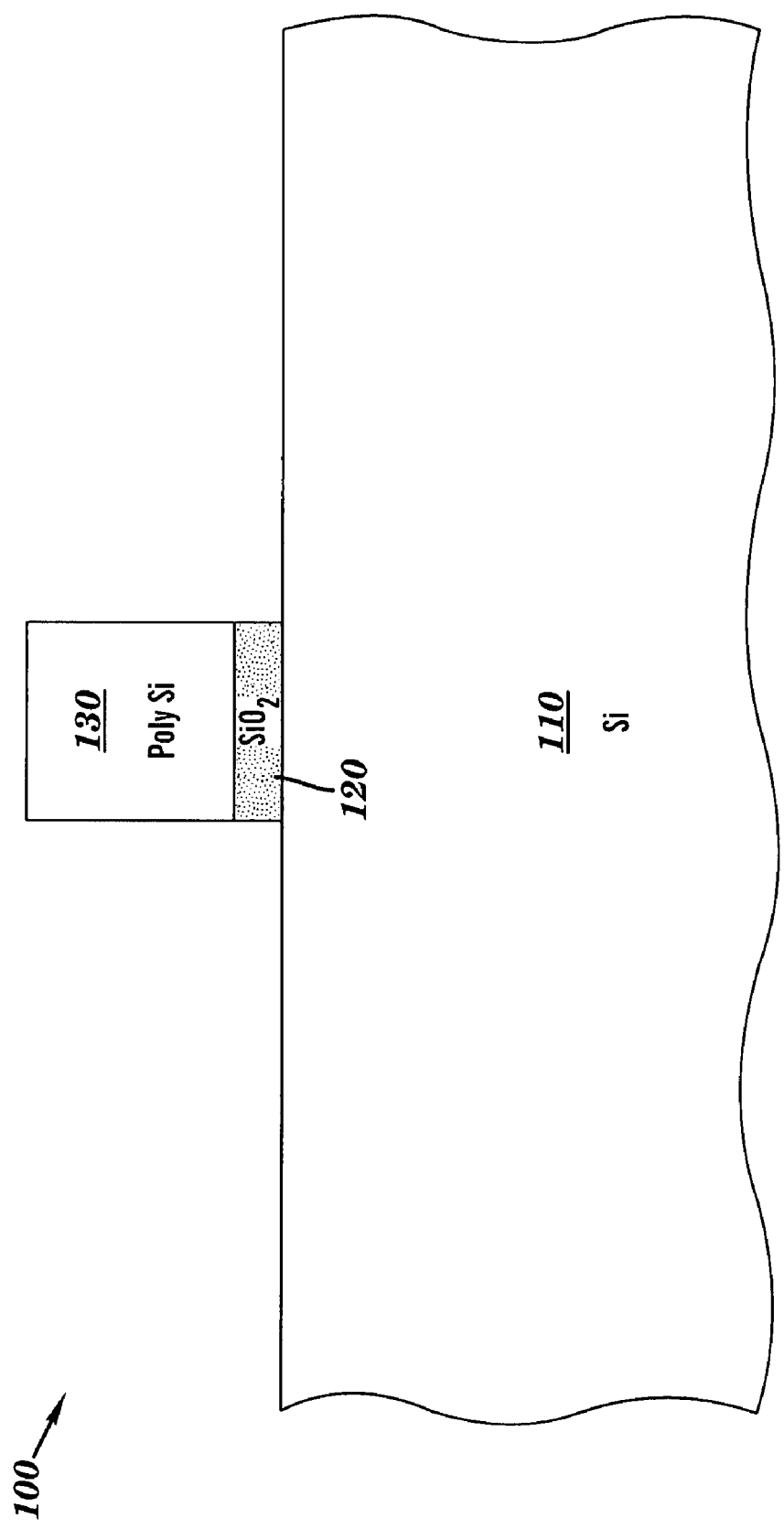
FIGS. 1-7 illustrate cross-section views of a first semiconductor structure going through steps of a first fabrication method, in accordance with embodiments of the present invention.

FIGS. 1-7 illustrate cross-section views of a first semiconductor structure 100 going through steps of a first fabrication method, in accordance with embodiments of the present invention. More specifically, with reference to FIG. 1, in one embodiment, the first fabrication method starts out with a semiconductor (e.g., silicon, germanium, etc.) substrate 110. Next, a gate stack 120,130 is formed on top of the semiconductor substrate 110. In one embodiment, the gate stack 120, 130 comprises (i) a gate dielectric region 120 on the semiconductor substrate 110 and (ii) and a gate region 130 on the gate dielectric region 120. Illustratively, the gate dielectric region 120 comprises silicon dioxide ($SiO_2$) while the gate region 130 comprises doped polysilicon.

In one embodiment, the gate stack 120,130 is formed by (a) forming a gate dielectric layer (not shown) on the substrate 110, then (b) forming a gate layer (not shown) on the gate dielectric layer, and then (c) patterning a photoresist layer to define the gate stack, and (d) directionally etching back the gate layer and the gate dielectric layer stopping at the substrate 110 such that what remain of the gate layer and the gate dielectric layer after the etching are the gate region 130 and the gate dielectric region 120, respectively. The directional etching in step (d) may be performed using a traditional lithography process.

Figure 2:
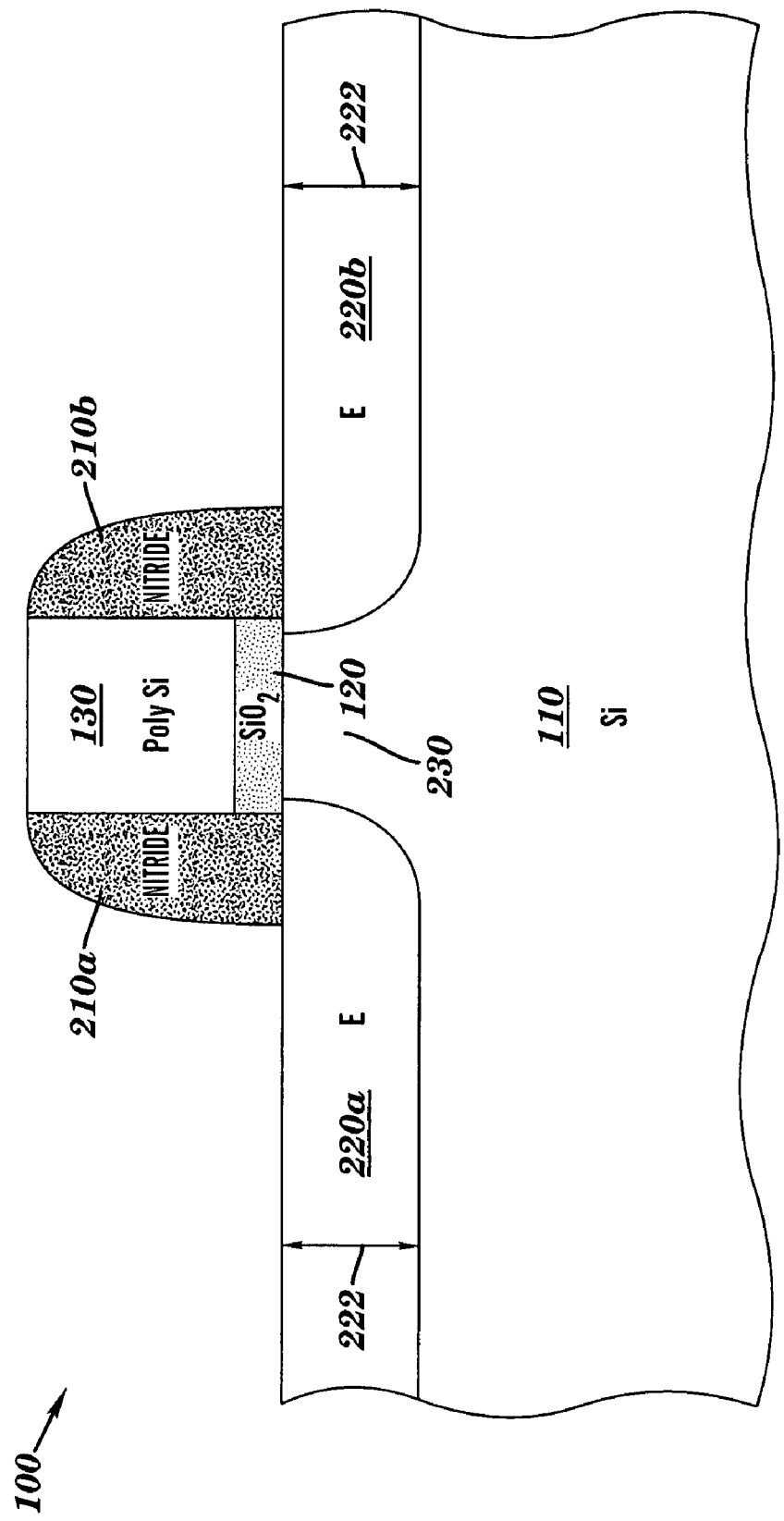

Next, in one embodiment, with reference to FIG. 2, extension spacers 210a and 210b are formed on side walls of the gate stack 120,130. Illustratively, the extension spacers 210a and 210b are formed by (a) depositing an extension spacer layer (not shown) on the entire structure 100 of FIG. 1, and then (b) directionally etching back the extension spacer layer, leaving the extension spacers 210a and 210b on side walls of the gate stack 120,130. In one embodiment, the extension spacers 210a and 210b comprise silicon nitride.

Next, the gate stack 120,130 and the extension spacers 210a and 210b are used as a blocking mask for forming source/drain (S/D) extension regions 220a and 220b in the semiconductor substrate 110 by, illustratively, ion implantation. As a result, a channel region 230 in the substrate 110 is defined that is (a) directly beneath and in direct physical contact with the gate dielectric region 120 and (b) disposed between and in direct physical contact with the S/D extension regions 220a and 220b.

If the structure 100 is to be an N channel field effect transistor (FET), then P type dopants (e.g. B and/or In) are implanted into the channel region 230 (concentration ~$10^{18}$-$10^{19}$ atoms/cm$^3$) and N type dopants (e.g., arsenic and/or phosphorous atoms) are implanted in the substrate 110 to form the S/D extension regions 220a and 220b with dopant concentration after S/D anneal being, illustratively, about $10^{19}$-$10^{20}$ atoms/cm$^3$. In contrast, if the structure 100 is to be a P channel FET, then N type dopants (e.g. As and/or P) are implanted into channel region (concentration ~$10^{18}$-$10^{19}$ atoms/cm$^3$) and P type dopants (e.g., boron atoms) are implanted in the substrate 110 to form the S/D extension regions 220a and 220b with dopant concentration after S/D anneal being, illustratively, about $10^{19}$-$10^{20}$ atoms/cm$^3$. In one embodiment, the thickness (depth) 222 of the S/D extension regions 220a and 220b is in a range of 20-40 nm after S/D anneal.

Figure 3:
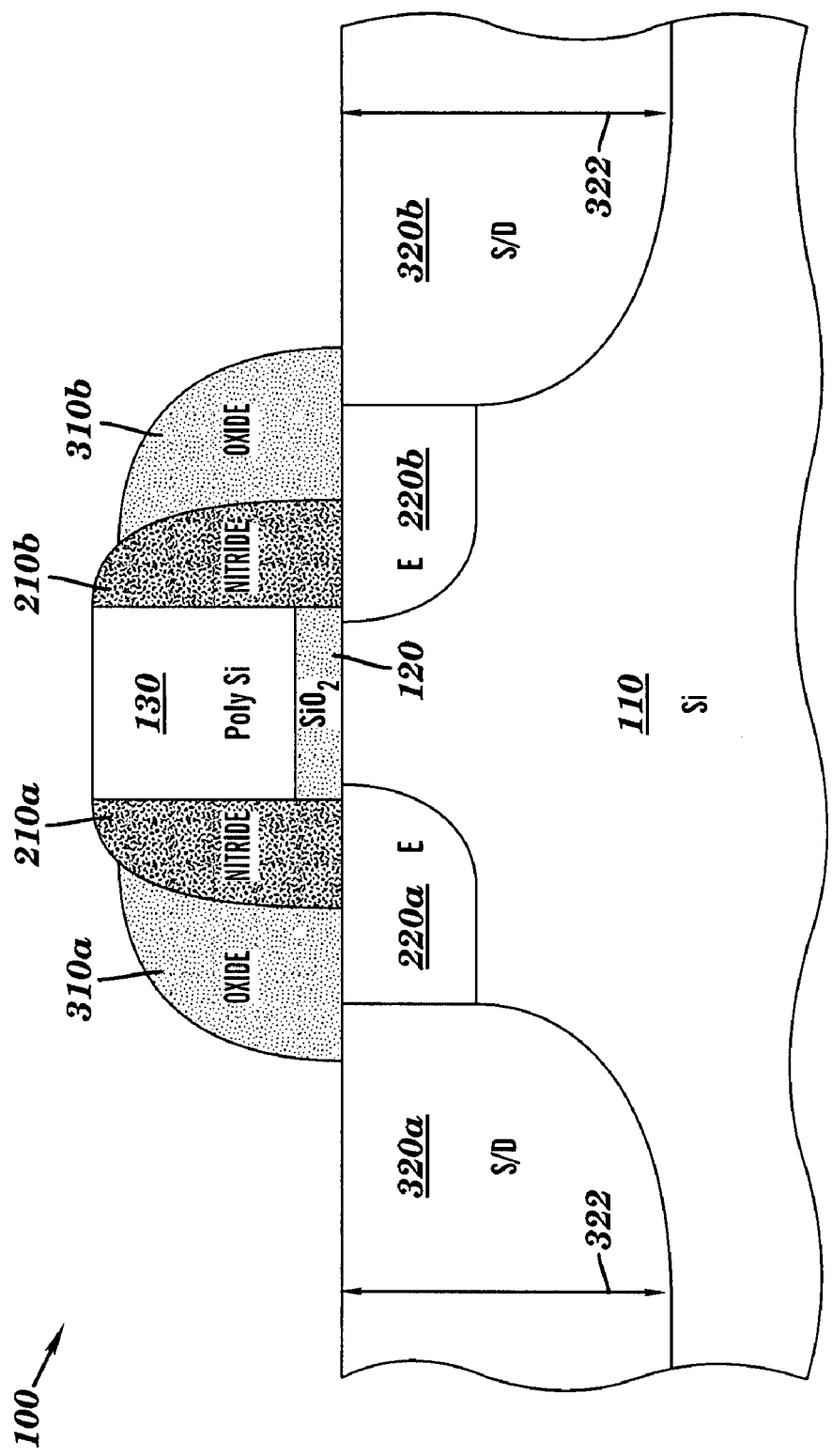

Next, with reference to FIG. 3, in one embodiment, S/D spacers 310a and 310b are formed on side walls of the extension spacers 210a and 210b, respectively. Illustratively, the S/D spacers 310a and 310b are formed by (a) depositing an S/D spacer layer (not shown) on the entire structure 100 of FIG. 2, and then (b) directionally etching back the S/D spacer layer, leaving the S/D spacers 310a and 310b on side walls of the extension spacers 210a and 210b, respectively. In one embodiment, the S/D spacers 310a and 310b comprise silicon dioxide ($SiO_2$).

Next, the gate stack 120,130, the extension spacers 210a and 210b, and the S/D spacers 310a and 310b are used as a blocking mask for forming S/D regions 320a and 320b in the semiconductor substrate 110 by, illustratively, ion implantation. Polysilicon region 130 receives S/D ion implantation in order to dope gate conductor to reduce resistance and electrical thickness of gate dielectrics. If the structure 100 is to be an N channel FET, then N type dopants (e.g., phosphorous atoms) are implanted in the substrate 110 to form the S/D regions 320a and 320b with dopant concentration after S/D anneal being, illustratively, $10^{20}$ atoms/cm$^3$. In contrast, if the structure 100 is to be a P channel FET, then P type dopants (e.g., boron atoms) are implanted in the substrate 110 to form the S/D regions 320a and 320b with dopant concentration after S/D anneal being, illustratively, $10^{20}$ atoms/cm$^3$. In one embodiment, after the S/D regions 320a and 320b are formed, a S/D anneal process (e.g., 950 1100 C. for 1-10 seconds and/or laser spike anneal) is performed to activate dopants in S/D extension regions 220a and 220b, the S/D regions 320a and 320b, and the polysilicon gate region 130. In one embodiment, the thickness (depth) 322 of the S/D regions 320a and 320b after the S/D anneal process is in a range of 50-150 nm.

Figure 4:
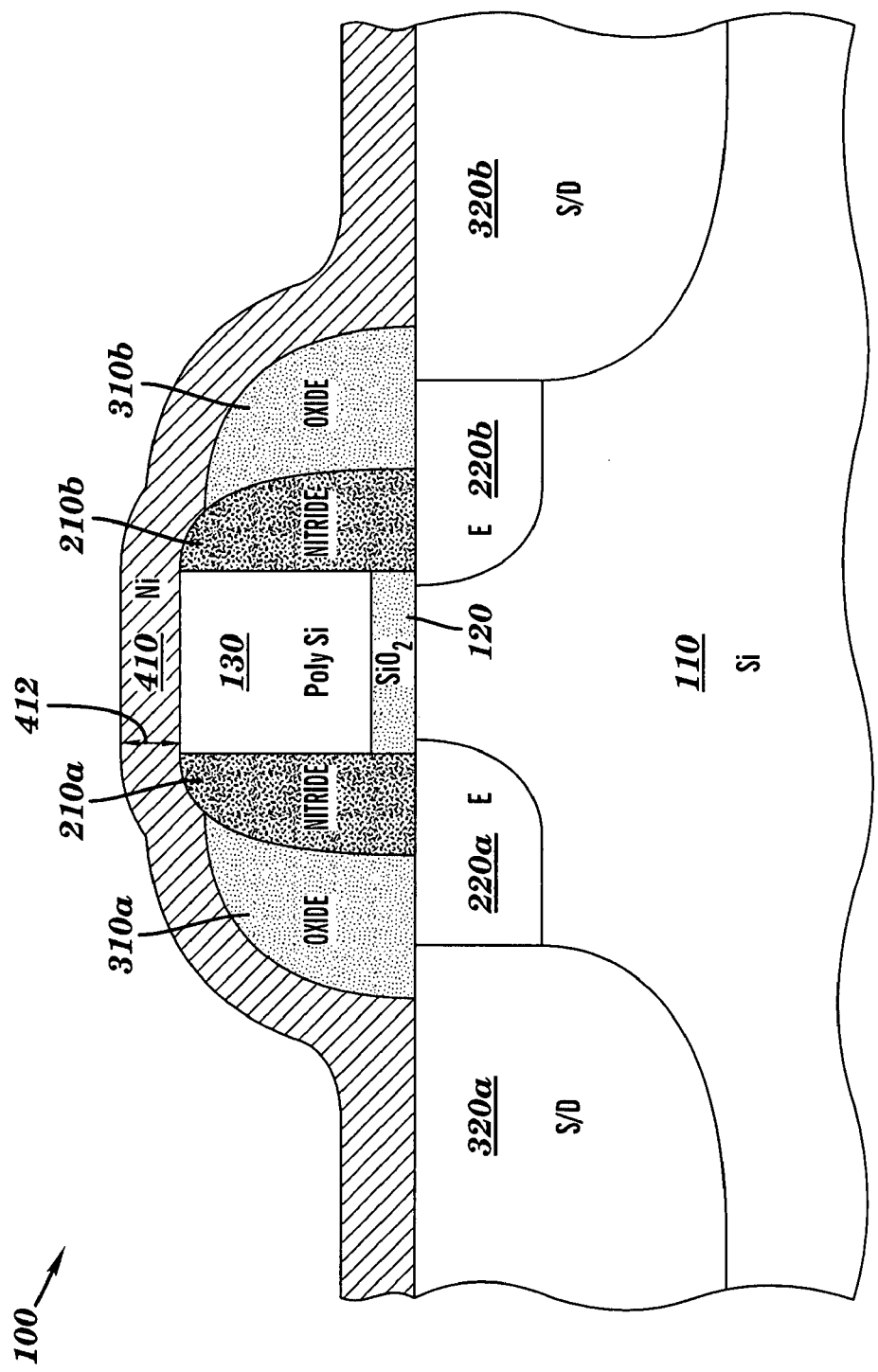

Next, with reference to FIG. 4, in one embodiment, a thick metal layer 410 is formed on top of the entire structure 100 of FIG. 3. Illustratively, the metal layer 410 comprises nickel (Ni) and has a thickness 412 in a range of 4-15 nm. The metal layer 410 may be formed by a physical vapor deposition process (PVD) or atomic layer deposition (ALD).

Figure 5:
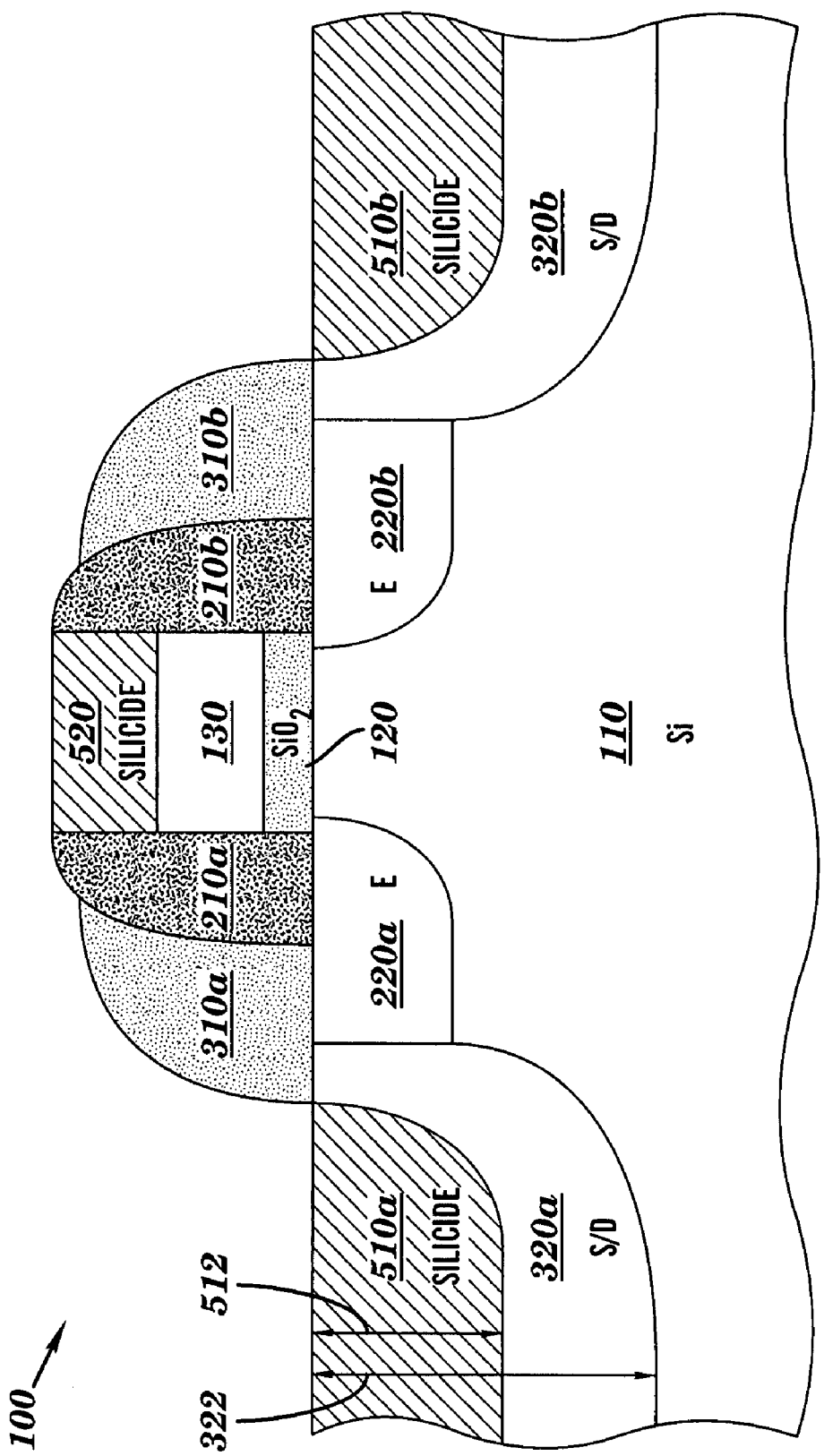

Next, in one embodiment, the structure 100 of FIG. 4 is annealed (heated) at a temperature in a range of 300-450° C. for about 1-10 sec so as to cause nickel of the metal layer 410 to (a) chemically react with silicon of the substrate 110 to form silicide nickel regions 510a and 510b (FIG. 5) and (b) chemically react with silicon of the polysilicon gate region 130 to form a silicide nickel region 520. Then, the unreacted nickel is removed by, illustratively, a wet etch step. The resultant structure 100 is shown in FIG. 5. With reference to FIG. 5, in one embodiment, the thickness 512 of the silicide regions 510a and 510b is less than the thickness 322 of the S/D regions 320a and 320b.

Figure 6:
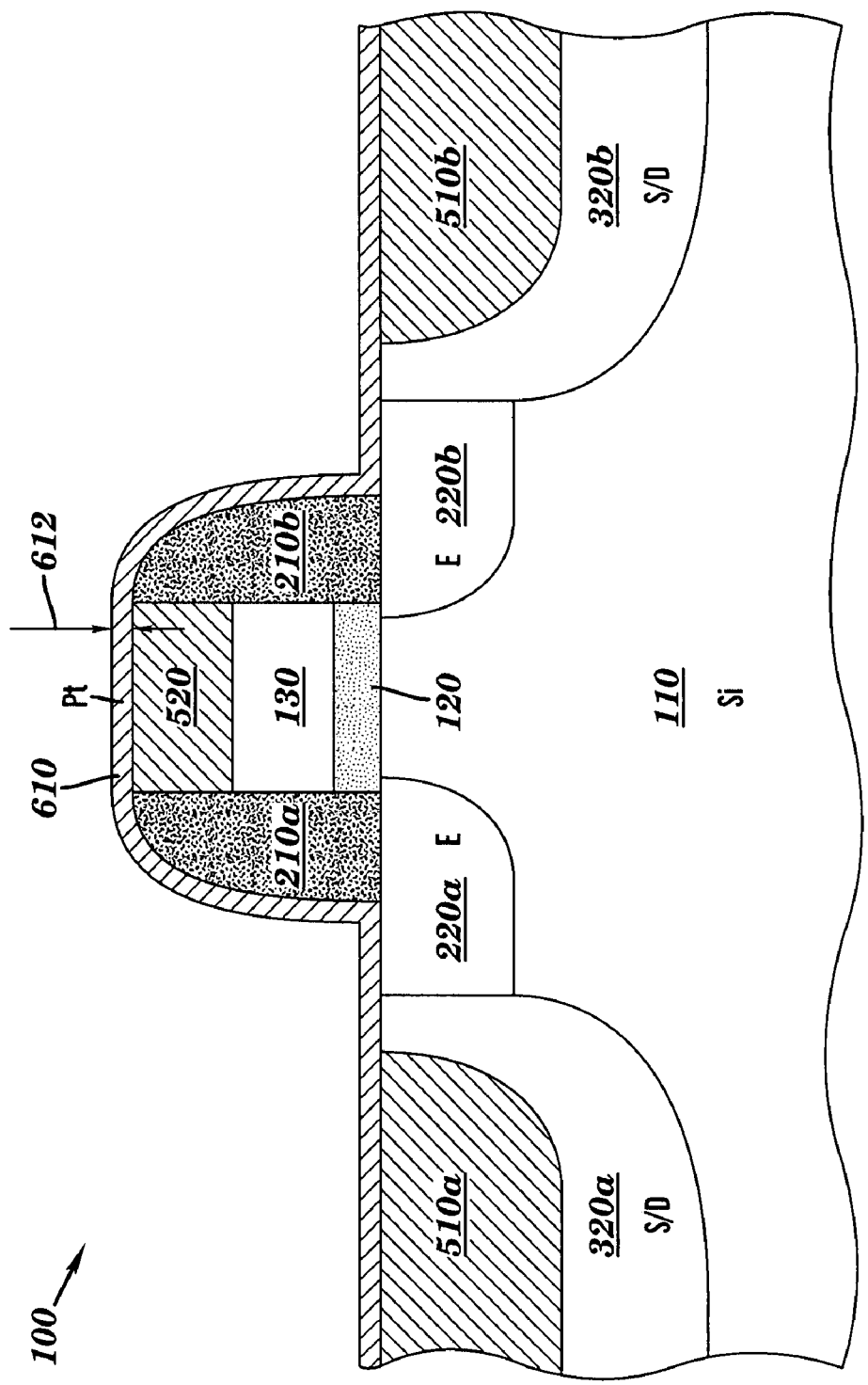

Next, with reference to FIG. 6, in one embodiment, the spacers of 310a and 310b (FIG. 5) are etched away and then a thin metal layer 610 is formed on top of the entire structure 100. Illustratively, the metal layer 610 comprises platinum (Pt) and has a thickness 612 in a range of 2-4 nm. The metal layer 610 may be formed by a physical vapor deposition (PVD) process or atomic layer deposition (ALD).

Figure 7:
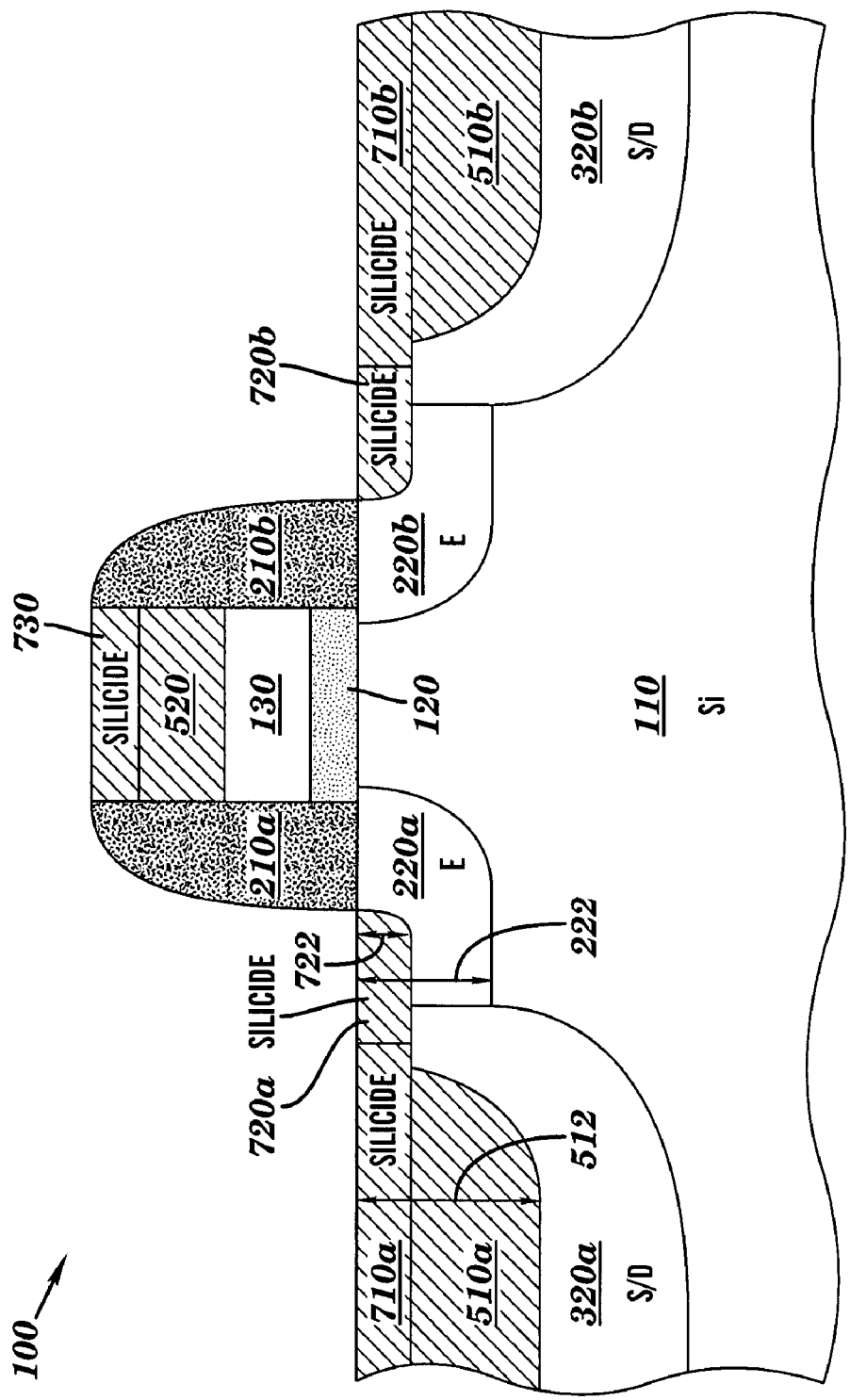

Next, in one embodiment, the structure 100 of FIG. 6 is annealed (heated) at a temperature in a range of, illustratively, 300-450° C. (preferably, this temperature range is selected so as to not change the property of silicide regions 510a and 510b) for about 1-10 sec so as to cause platinum of the metal layer 610 to (a) chemically react with NiSi of the silicide regions 510a and 510b to form NiPtSi regions 710a and 710b, respectively (FIG. 7), (b) chemically react with silicon of the substrate 110 to form silicide platinum (PtSi) regions 720a and 720b (FIG. 7), and (c) chemically react with NiSi on top of the gate region 130 to form a NiPtSi 730 (FIG. 7). Then, the unreacted platinum material is removed by, illustratively, a wet etch step. The resultant structure 100 is shown in FIG. 7. With reference to FIG. 7, in one embodiment, the thickness 722 of the PtSi regions 720a and 720b is less than the depth 222 of the S/D extension regions 220a and 220b, and is also less than the depth 512 of the silicide regions 510a and 510b.

FIGS. 8-11 illustrate cross-section views of a second semiconductor structure 200 going through steps of a second fabrication method, in accordance with embodiments of the present invention. More specifically, in one embodiment, the second fabrication method starts out with the structure 100 of FIG. 5. The same reference numerals will be used to indicate that the regions in the figures are similar.

Figure 8:
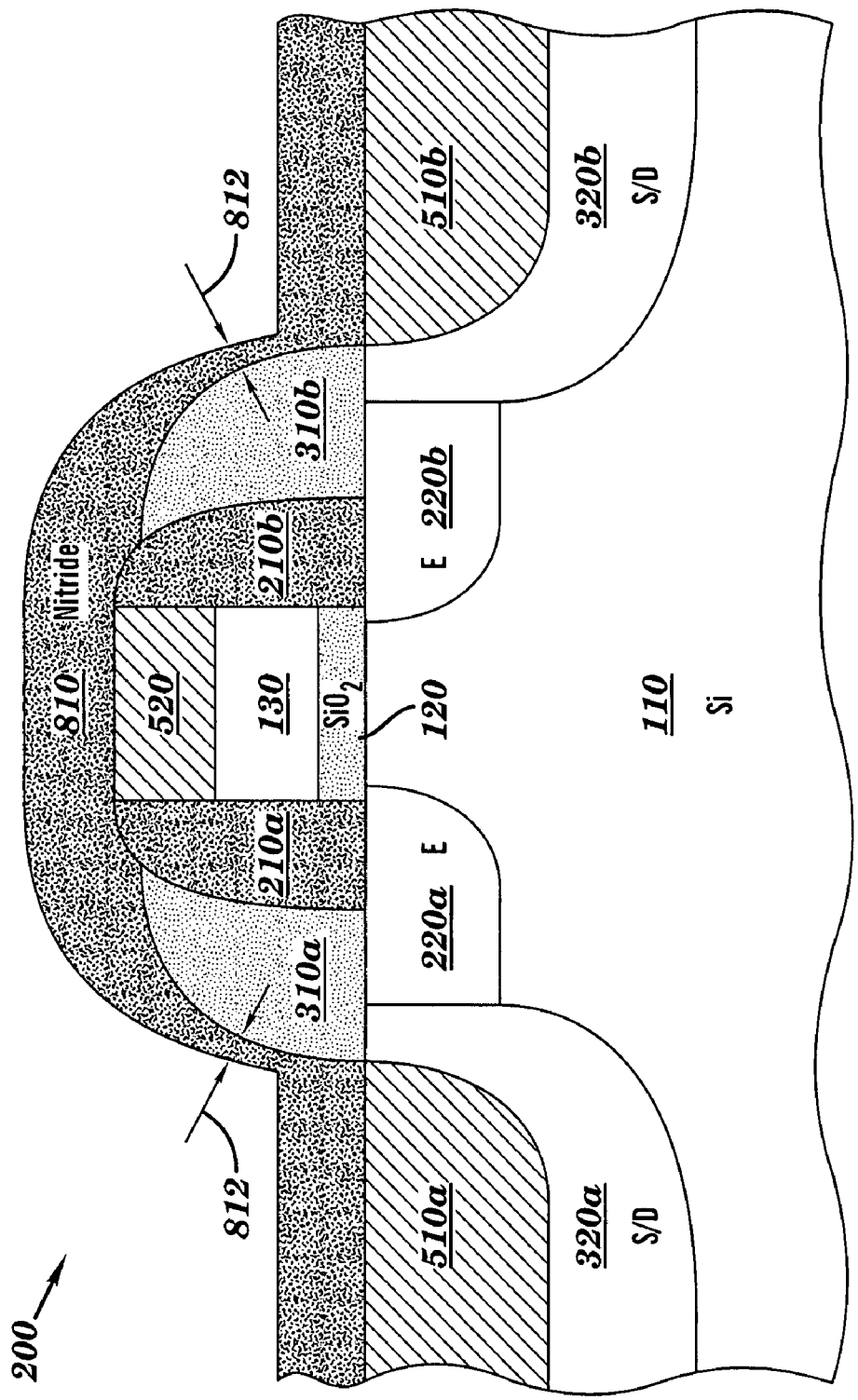
FIGS. 8-11 illustrate cross-section views of a second semiconductor structure going through steps of a second fabrication method, in accordance with embodiments of the present invention.

Next, with reference to FIG. 8, in one embodiment, a nitride layer 810 is directionally formed on top of the entire structure 100 of FIG. 5 such that the nitride layer 810 is thinnest (corresponding to the thickness 812) on side walls of the S/D spacers 310a and 310b. In one embodiment, the nitride layer 810 is formed by a plasma enhanced CVD process or high density plasma (HDP) deposition.

Figure 9:
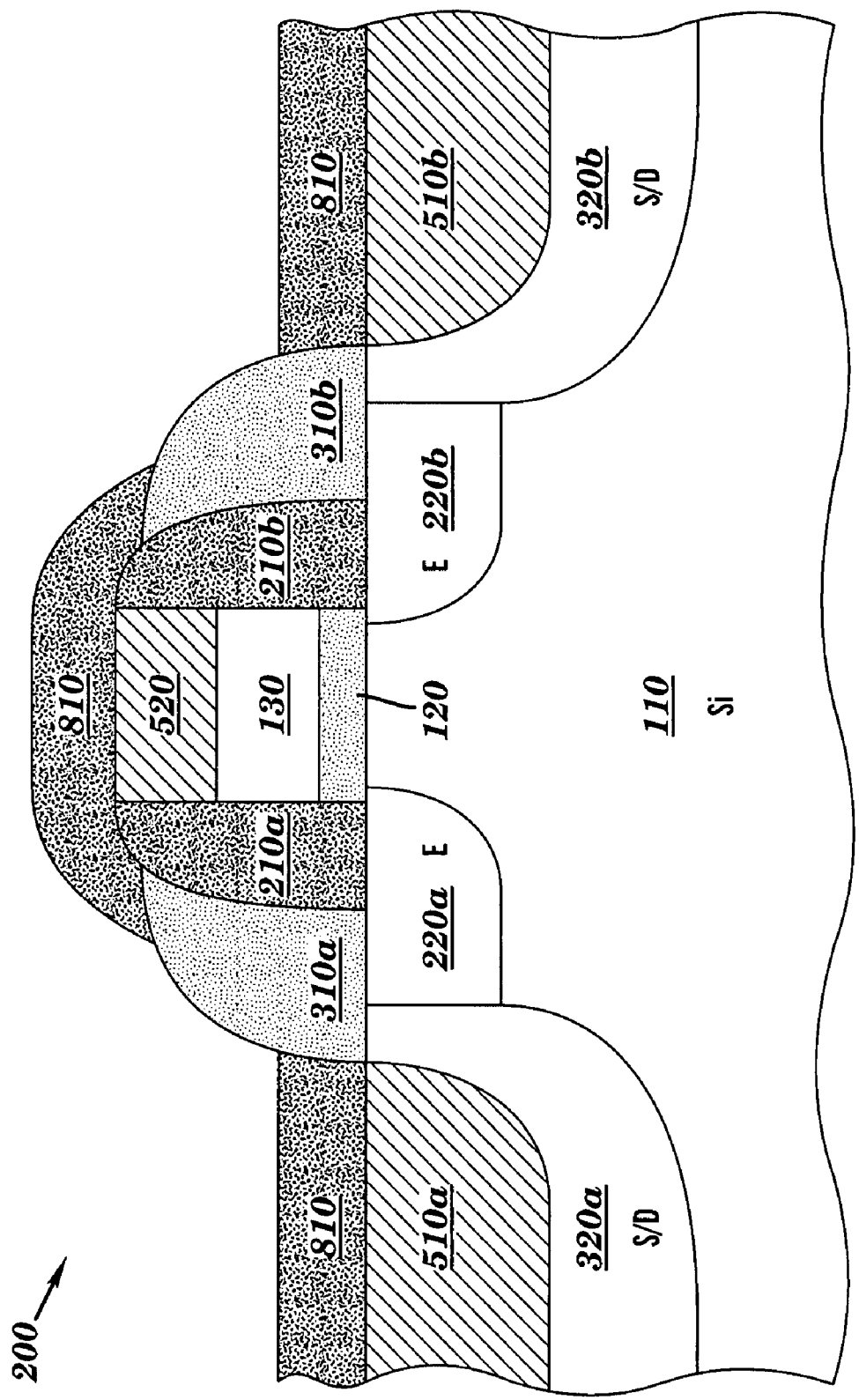

Next, the nitride layer 810 is isotropically etched back by, illustrative, a wet/dry etch process (non-directional) such that only portions of the nitride layer 810 that cover the S/D spacers 310a and 310b are etched. As a result, the S/D spacers 310a and 310b are partially exposed to the surrounding ambient. The resultant structure 200 is shown in FIG. 9. Next, the S/D spacers 310a and 310b are removed by, illustratively, a wet etch process.

Figure 10:
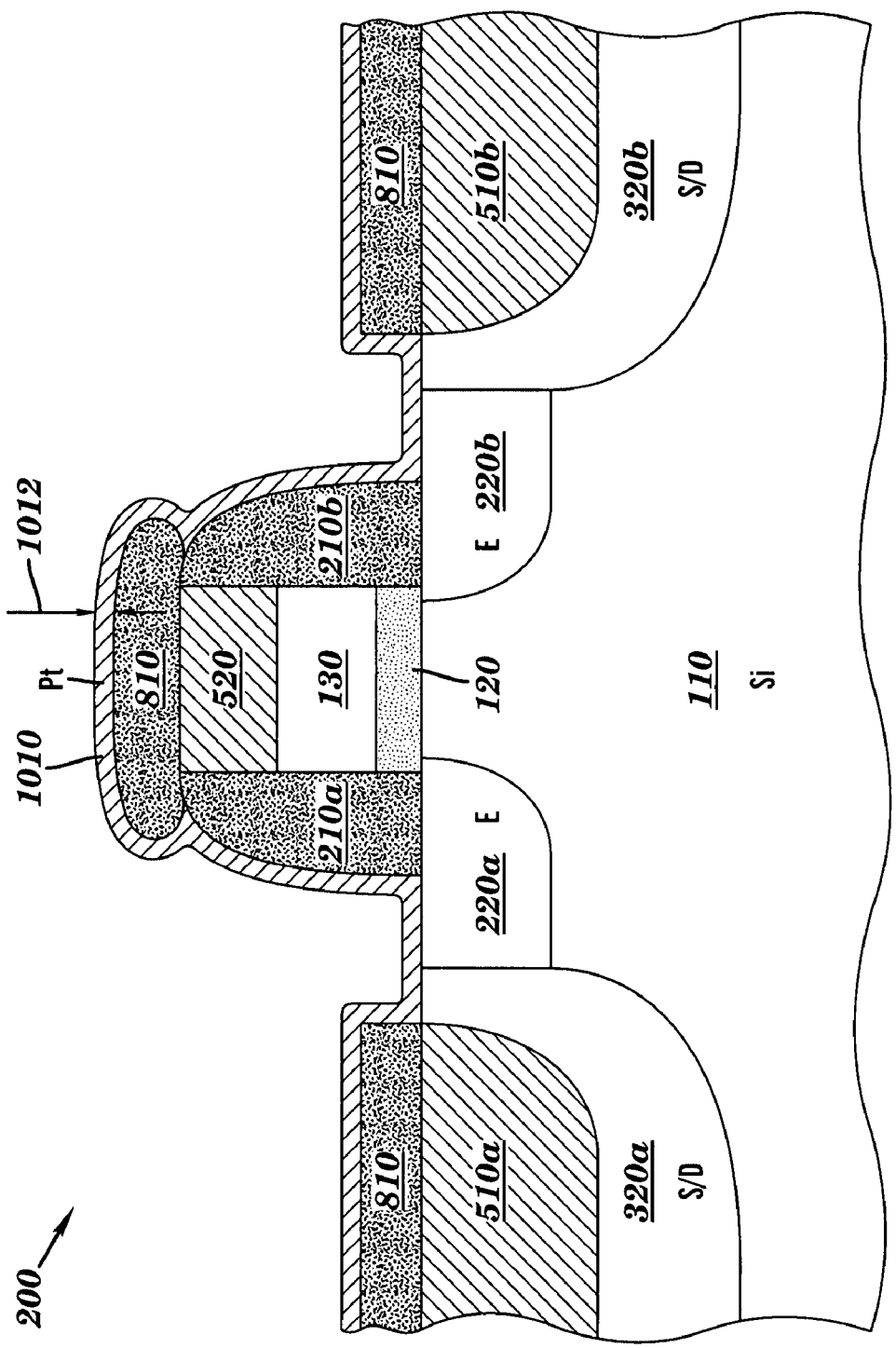

Next, with reference to FIG. 10, in one embodiment, a thin metal layer 1010 is formed on top of the entire structure 100 of FIG. 9 (with the S/D spacers 310a and 310b having been removed). Illustratively, the metal layer 1010 comprises platinum (Pt) and has a thickness 1012 in a range of 2-4 nm. The metal layer 1010 may be formed by a PVD process or atomic layer deposition (ALD).

Figure 11:
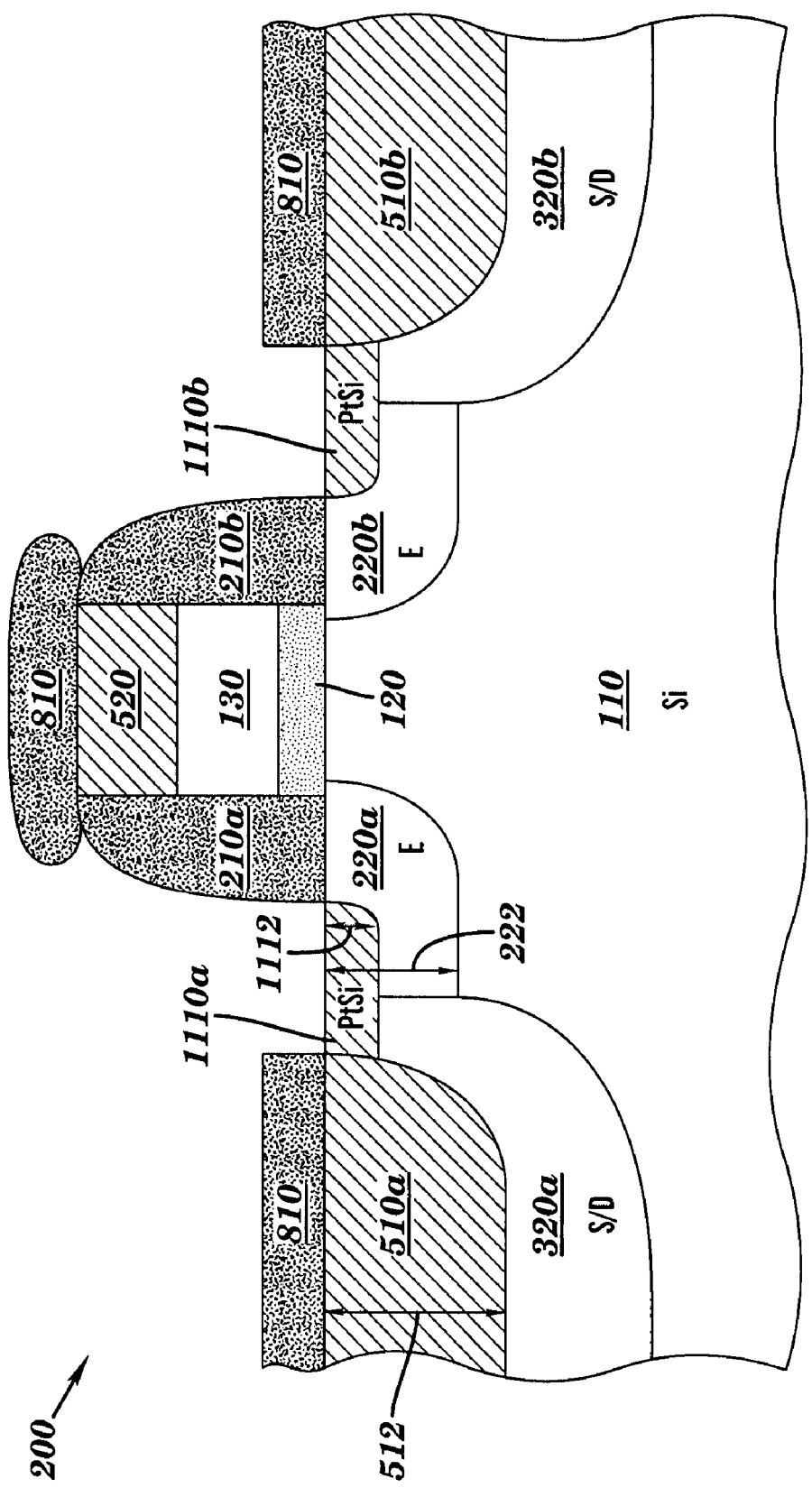

Next, in one embodiment, the structure 100 of FIG. 10 is annealed (heated) at a temperature m a range of, illustratively, 300-450° C. (preferably, this temperature range is selected so as to not change the property of silicide regions 510a and 510b) for about 1-10 sec so as to cause platinum of the metal layer 1010 to chemically react with silicon of the substrate 110 to form silicide platinum (PtSi) regions 1110a and 1110b (FIG. 11). Then, the unreacted platinum material is removed by, illustratively, a wet etch step. The resultant structure 200 is shown in FIG. 11. With reference to FIG. 11, in one embodiment, the thickness 1112 of the PtSi regions 1110a and 1110b is less than the depth 222 of the S/D extension regions 220a and 220b, and is also less than the depth 512 of the silicide regions 510a and 510b.

FIGS. 12-15 illustrate cross-section views of a third semiconductor structure 300 going through steps of a third fabrication method, in accordance with embodiments of the present invention. More specifically, in one embodiment, the third fabrication method starts out with the structure 100 of FIG. 3 with the oxide S/D spacers 310a and 310b being removed by, illustratively, a wet etch process. The same reference numerals will be used to indicate that the regions in the figures are similar.

Figure 12:
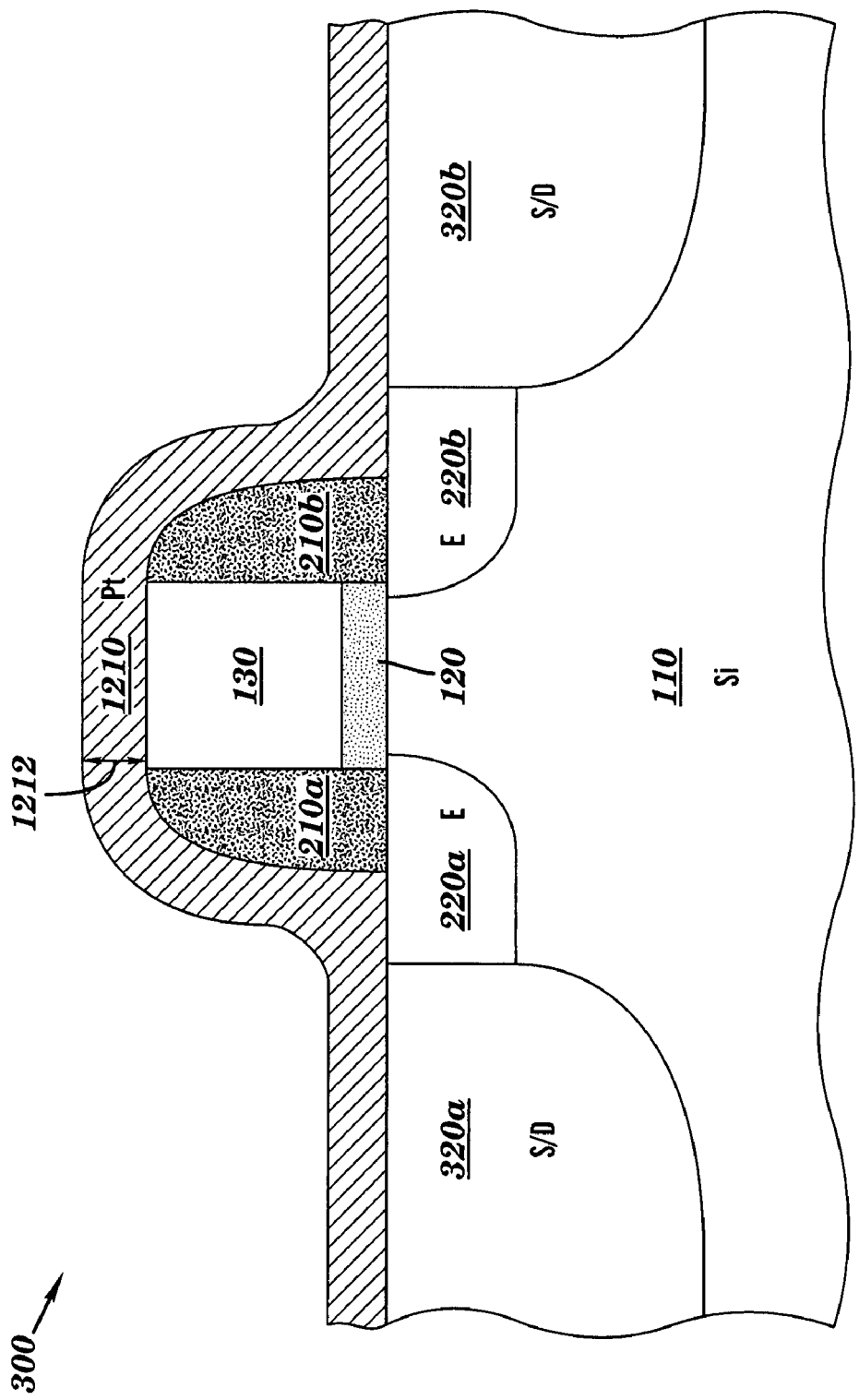
FIGS. 12-15 illustrate cross-section views of a third semiconductor structure going through steps of a third fabrication method, in accordance with embodiments of the present invention.

Next, with reference to FIG. 12, in one embodiment, a thin metal layer 1210 is formed on top of the entire structure 100 of FIG. 3 (with the oxide S/D spacers 310a and 310b having being removed). Illustratively, the metal layer 1210 comprises platinum (Pt) and has a thickness 1212 in a range of 2-4 nm. The metal layer 1210 may be formed by a PVD process or atomic layer deposition (ALD). In an alternative embodiment, the metal layer 1210 comprises a nickel platinum alloy with nickel percentage being smaller than 5% in molecule number.

Figure 13:
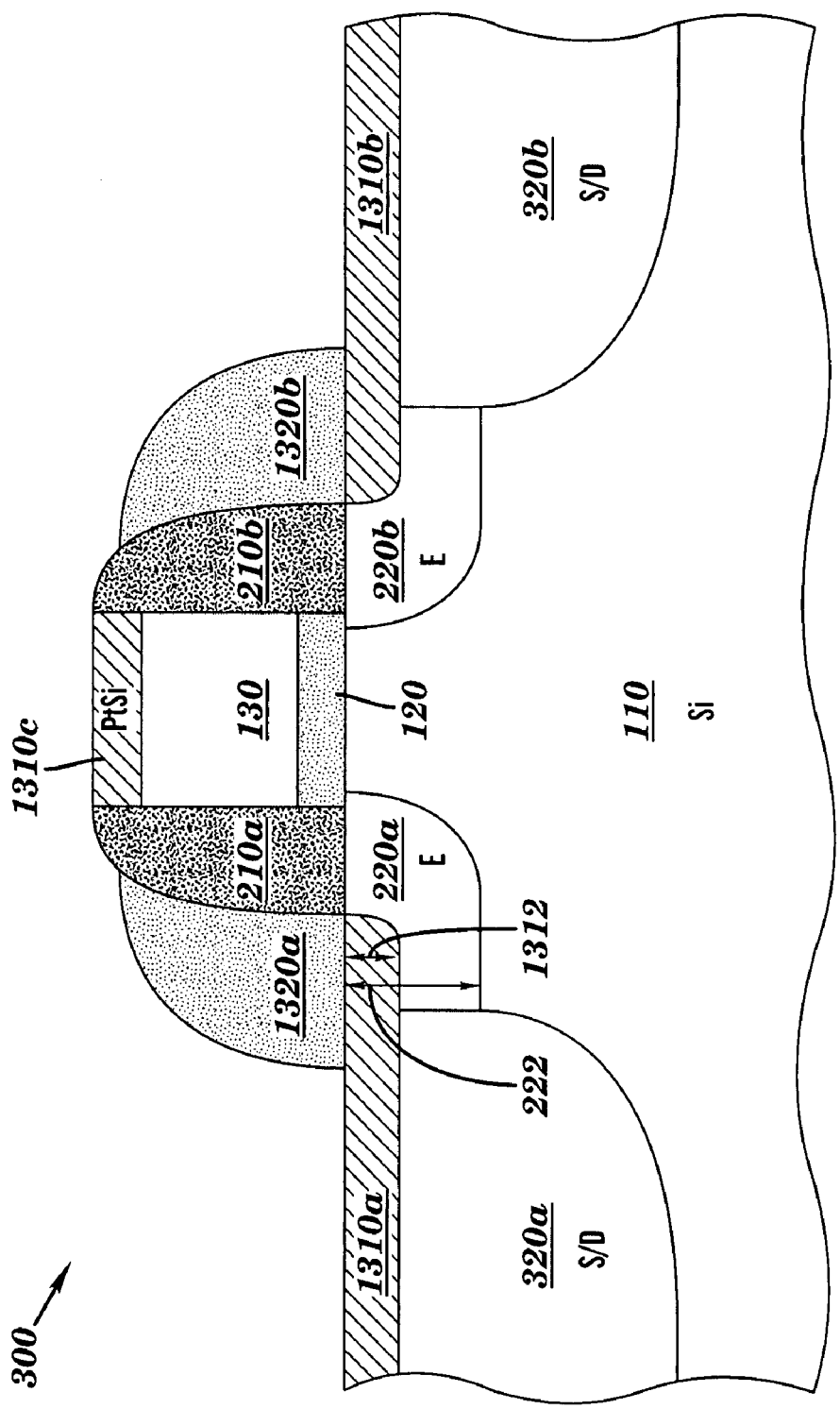

Next, in one embodiment, the structure 300 of FIG. 12 is annealed (heated) at a temperature in a range of, illustratively, 300-450° C. for about 10 sec so as to cause platinum of the metal layer 1210 to (a) chemically react with silicon of the substrate 110 to form silicide platinum (PtSi) regions 1310a and 1310b (FIG. 13) and (b) chemically react with silicon of the polysilicon gate region 130 to form a silicide platinum region 1310c (FIG. 13). Then, the unreacted platinum material is removed by, illustratively, a wet etch step. The resultant structure 300 is shown in FIG. 13. With reference to FIG. 13, in one embodiment, the thickness 1312 of the PtSi regions 1310a and 1310b is less than the depth 222 of the S/D extension regions 220a and 220b.

Next, in one embodiment, spacers 1320a and 1320b are formed on side walls of the extension spacers 210a and 210b, respectively. The spacers 1320a and 1320b may comprise silicon dioxide ($SiO_2$).

Figure 14:
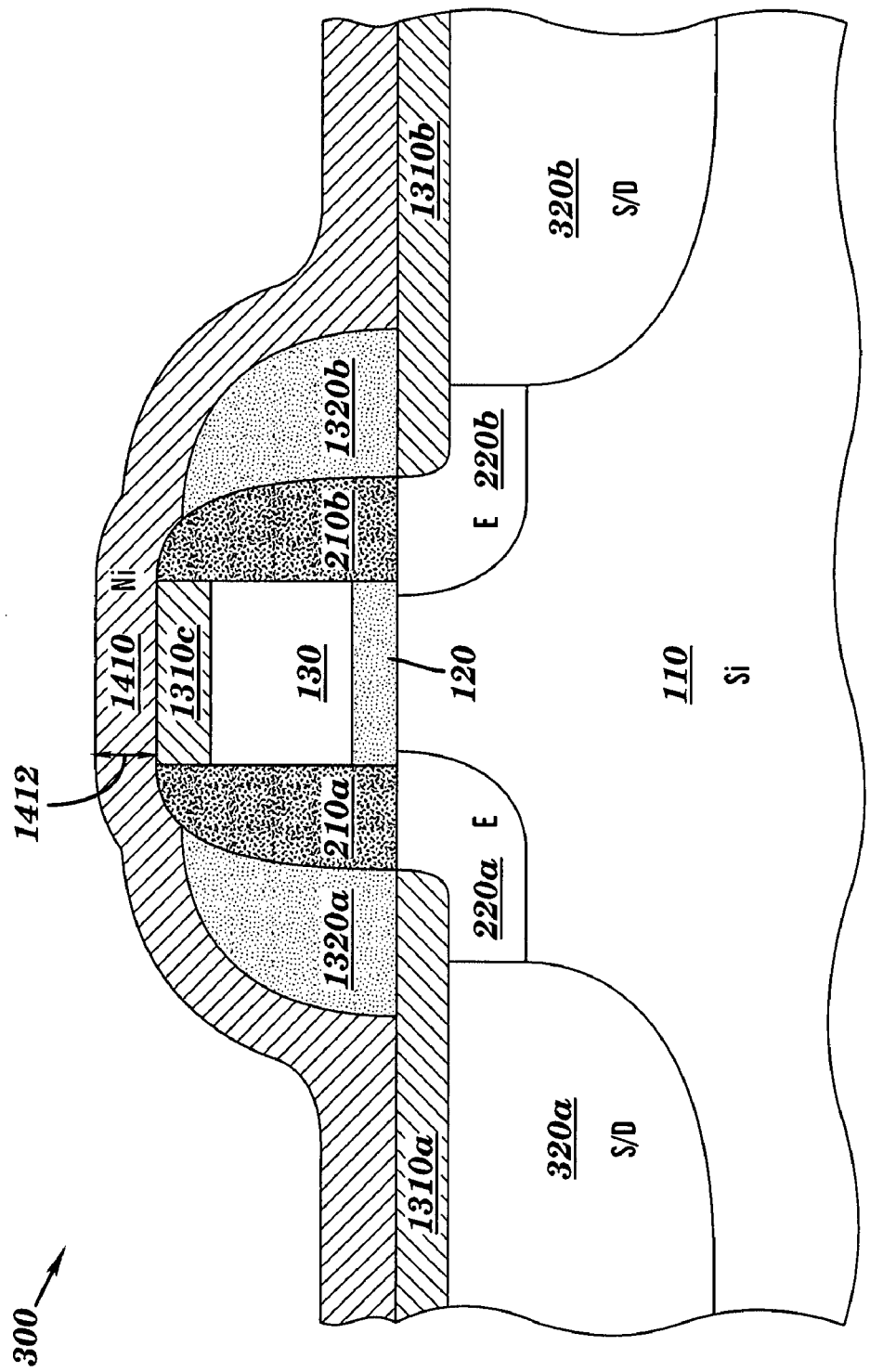

Next, with reference to FIG. 14, in one embodiment, a thick metal layer 1410 is formed on top of the entire structure 300 of FIG. 13. Illustratively, the metal layer 1410 comprises nickel (Ni or NiPt) and has a thickness 1412 in a range of 4-15 nm. The metal layer 1410 may be formed by a CVD process.

Figure 15:
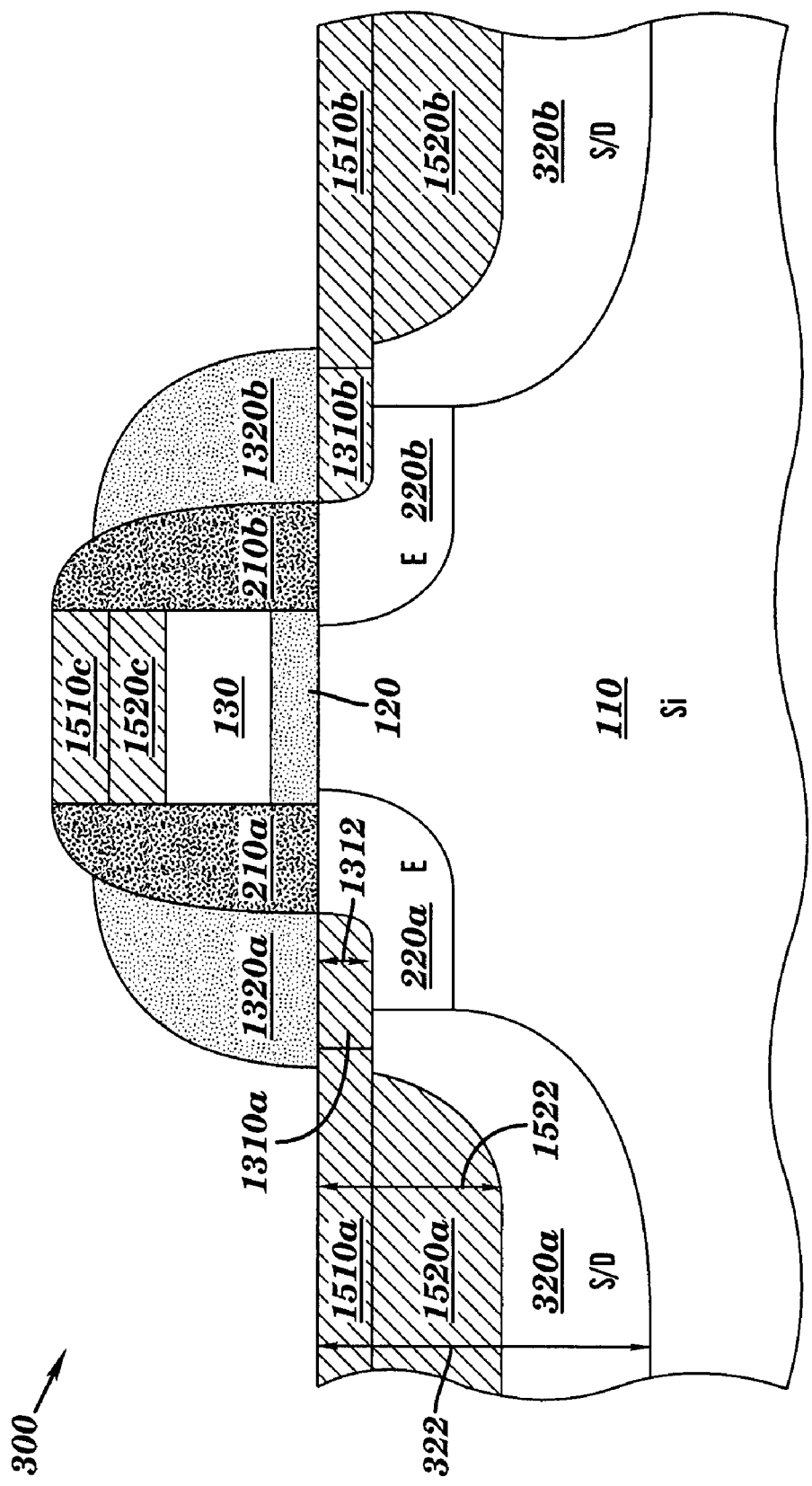

Next, in the embodiment in which the metal layer 1410 comprises nickel as identified supra, the structure 300 of FIG. 14 is annealed (heated) at a temperature in a range of, illustratively, 300-450° C. (preferably, this temperature range is selected so as to not change the property of portions of the silicide regions 1310a and 1310b directly under the spacers of 1320a and 1320b, respectively) for about 1-10 sec so as to cause nickel of the metal layer 1410 to (a) chemically react with PtSi of the silicide regions 1310a and 1310b to form NiPtSi regions 1510a and 1510b, respectively (FIG. 15), (b) diffuse down and chemically react with silicon of the substrate 110 to form silicide nickel (NiSi) regions 1520a and 1520b (FIG. 15), (c) chemically react with PtSi of the silicide region 1310c to form a NiPtSi region 1510c (FIG. 15), and (d) diffuse down and chemically react with silicon of the polysilicon gate region 130 to form NiSi 1520c (FIG. 15). Then, the unreacted nickel material is removed by, illustratively, a wet etch step. The resultant structure 300 is shown in FIG. 15. With reference to FIG. 15, in one embodiment, the depth 1522 of the PtSi regions 1520a and 1520b is less than the depth 322 of the S/D regions 320a and 320b, but is greater than the depth 1312 of the PtSi regions 1310a and 1310b.

In summary, with reference to FIGS. 7, 11, and 15, in the three structures 100, 200, and 300, portions of the S/D extension regions 220a and 220b and the S/D regions 320a and 320b are replaced by electrically conducting silicide materials (PtSi, NiSi, and NiPtSi) as much as possible, without eliminating the junctions between the S/D extension regions 220a and 220b and the substrate 110 as well as the junctions between the S/D regions 320a and 320b and the substrate 110. In other words, the silicide regions (also referred to as the contact regions) are formed thinner in the S/D extension regions 220a and 220b and thicker in the S/D regions 320a and 320b. For instance, with reference to FIG. 7, the contact region 510a,710a,720a is thinner in the S/D extension regions 220a (thickness 722) and thicker in the S/D regions 320a (thickness 512). Similarly, the contact region 510b, 710b,720b is thinner in the S/D extension regions 220a and thicker in the S/D regions 320a.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A semiconductor structure fabrication method, comprising:

providing a semiconductor structure comprising:
  (a) a semiconductor layer including (i) a channel region and (ii) first and second source/drain (S/D) extension regions, and (iii) first and second S/D regions,
    wherein the channel region is disposed between and in direct physical contact with the first and second S/D extension regions,
    wherein the first S/D extension region is disposed between and in direct physical contact with the first S/D region and the channel region, and
    wherein the second S/D extension region is disposed between and in direct physical contact with the second S/D region and the channel region,
  (b) a gate dielectric region in direction physical contact with the channel region via a first interfacing surface that defines a reference direction essentially perpendicular to the first interfacing surface, and
  (c) a gate region in direct physical contact with the gate dielectric region, wherein the gate dielectric region is sandwiched between and electrically insulates the gate region and the channel region; and forming (i) a first shallow contact region in direct physical contact with the first S/D extension region, and (ii) a first deep contact region in direct physical contact with the first S/D region and the first shallow contact region,
  wherein the first shallow contact region is physically isolated from the semiconductor layer by the first S/D region and the first S/D extension region,
  wherein the first shallow contact region is thinner than the first deep contact region in the reference direction,
  wherein the first shallow contact region comprises a first silicide material, wherein the first deep contact region comprises a second silicide material, wherein the first silicide material is different from the second silicide material.

2. The method of claim 1, wherein the first deep contact region is physically isolated from the semiconductor layer by the first S/D region and the first S/D extension region.

3. The method of claim 1, further comprising:

forming a second shallow contact region in direct physical contact with the second S/D extension region;

forming a second deep contact region in direct physical contact with the second S/D region and the second shallow contact region, wherein the second shallow contact region is physically isolated from the semiconductor layer by the second S/D region and the second S/D extension region, and wherein the second shallow contact region is thinner than the second deep contact region in the reference direction.

4. The method of claim 3, wherein the second deep contact region is physically isolated from the semiconductor layer by the second S/D region and the second S/D extension region.

5. The method of claim 1, wherein the first silicide material comprises silicide platinum, and wherein the second silicide material comprises silicide nickel.

6. The method of claim 5, wherein the semiconductor structure resulting from said providing further comprises a first extension spacer and a first S/D spacer, wherein the first extension spacer is in direct physical contact with the gate region, the gate dielectric region, and a first portion of the first S/D extension region, wherein the first S/D spacer is in direct physical contact with the first extension spacer, a second portion of the first S/D extension region, and the first S/D region.

7. The method of claim 6, wherein said forming the first shallow contact region and the first deep contact region comprises:

after said providing the semiconductor structure, transforming a top portion of the first S/D region into the first deep contact region by chemically reacting silicon in the top portion of the first S/D region with nickel which results in the first deep contact region comprising the second silicide material and being exposed to an ambient surrounding the semiconductor structure and which further results in a remaining portion of the first S/D region being covered by the first S/D spacer and not being exposed to the ambient;

after said transforming the top portion of the first S/D region, forming a nitride layer over the semiconductor structure such that the nitride layer covers and is in direct physical contact with the first deep contact region, the first S/D spacer, and the first extension spacer;

after said forming the nitride layer, removing a portion of the nitride layer to expose the first S/D spacer to the ambient such that the first extension spacer remains covered by the nitride layer;

after said removing the portion of the nitride layer, removing the first S/D spacer to expose both the remaining portion of the first S/D region and the second portion of the first S/D extension region to the ambient such that the first portion of the first S/D extension region is not exposed to the ambient;

after said removing the first S/D spacer, forming a metal layer comprising platinum over the semiconductor structure such that the metal layer is on and in direct physical contact with the remaining portion of the first S/D region and the second portion of the first S/D extension region; and after said forming the metal layer comprising platinum, annealing the semiconductor structure at a temperature sufficient to cause platinum from the metal layer to chemically react with silicon in both a top portion of the remaining portion of the first S/D region and a top portion of the second portion of the first S/D extension region to form the first shallow contact region comprising the first silicide material.

8. The method of claim 1, wherein the first S/D region is thicker than the first S/D extension region in the reference direction.

9. The method of claim 8, wherein the second S/D region is thicker than the second S/D extension region in the reference direction.

10. The method of claim 1, wherein the first shallow contact region consists of a first portion and a second portion, wherein the first and second portions of the first shallow contact region are in direct physical contact with each other, wherein the first portion of the first shallow contact region comprises the first silicide material, wherein the second portion of the first shallow contact region comprises a third silicide material, wherein the first silicide material comprises silicide nickel platinum, wherein the third silicide material comprises silicide platinum, and wherein the second silicide material comprises silicide nickel.

11. The method of claim 10, wherein the semiconductor structure resulting from said providing further comprises a first extension spacer and a first S/D spacer, wherein the first extension spacer is in direct physical contact with the gate region, the gate dielectric region, and a first portion of the first S/D extension region, wherein the first S/D spacer is in direct physical contact with the first extension spacer, a second portion of the first S/D extension region, and the first S/D region.

12. The method of claim 11, wherein said forming the first shallow contact region and the first deep contact region comprises:

after said providing the semiconductor structure, transforming a top portion of the first S/D region into a first silicide region by chemically reacting silicon in the top portion of the first S/D region with nickel which results in the first silicide region comprising the second silicide material and being exposed to an ambient surrounding the semiconductor structure and which further results in a remaining portion of the first S/D region being covered by the first S/D spacer and not being exposed to the ambient;

after said transforming the top portion of the first S/D region, removing the first S/D spacer to expose both the remaining portion of the first S/D region and the second portion of the first S/D extension region to the ambient such that the first portion of the first S/D extension region is not exposed to the ambient;

after said removing the first S/D spacer, forming a metal layer comprising platinum over the semiconductor structure such that the metal layer is on and in direct physical contact with the first silicide region, the remaining portion of the first S/D region, and the second portion of the first S/D extension region; and after said forming the metal layer comprising platinum, annealing the semiconductor structure at a temperature sufficient to cause platinum from the metal layer to:
  chemically react with the second silicide material in a top portion in the first silicide region to form the first portion of the first shallow contact region comprising the first silicide material, and
  chemically react with silicon in both a top portion of the remaining portion of first S/D region and a top portion of the second portion of the first S/D extension region to form the second portion of the first shallow contact region comprising the third silicide material.

13. The method of claim 11, wherein said forming the first shallow contact region and the first deep contact region comprises:
  after said providing the semiconductor structure, removing the first S/D spacer;
  after said removing the first S/D spacer, transforming a top portion of the first S/D region and a top portion of the second portion of the first S/D extension region into a first silicide region by chemically reacting the top portion of the first S/D region and the top portion of the second portion of the first S/D extension region with platinum which results in the first silicide region comprising the third silicide material and being exposed to an ambient surrounding the semiconductor structure;
  after said transforming the top portion of the first S/D region and the top portion of the second portion of the first S/D extension region, forming a second S/D spacer on a second portion of the first silicide region and not on a first portion of the first silicide region which results in the second portion of the first silicide region not being exposed to the ambient while the first portion of the first silicide region being exposed to the ambient, wherein the second S/D spacer is in direct physical contact with the first extension spacer;
  after said forming the second S/D spacer, forming a metal layer comprising nickel over the semiconductor structure such that the metal layer is on and in direct physical contact with the first portion of the first silicide region; and
  after said forming the metal layer comprising nickel, annealing the semiconductor structure at a temperature sufficient to cause nickel from the metal layer to:
    chemically react with the third silicide material in the first portion in the first silicide region to form the first portion of the first shallow contact region comprising the first silicide material and to fowl the second portion of the first shallow contact region as consisting of the second portion of the first silicide region that comprises the third silicide material, and
    chemically react with silicon in a middle portion of the first S/D region to form the first deep contact region comprising the second silicide material, wherein the first deep contact region is disposed between and in direct physical contact with the top portion of the first S/D region and a bottom portion of the first S/D region that has not chemically reacted with the nickel from the metal layer.

* * * * *